United States Patent
Rowe

(10) Patent No.: US 9,417,013 B2
(45) Date of Patent: Aug. 16, 2016

(54) HEAT TRANSFER SYSTEMS INCLUDING HEAT CONDUCTING COMPOSITE MATERIALS

(75) Inventor: Michael Paul Rowe, Pinckney, MI (US)

(73) Assignee: Toyota Motor Engineering & Manufacturing North America, Inc., Erlanger, KY (US)

( * ) Notice: Subject to any disclaimer, the term of this patent is extended or adjusted under 35 U.S.C. 154(b) by 1098 days.

(21) Appl. No.: 12/945,027

(22) Filed: Nov. 12, 2010

(65) Prior Publication Data

US 2012/0118549 A1    May 17, 2012

(51) Int. Cl.

| | | |
|---|---|---|
| *F28F 27/00* | (2006.01) | |
| *F28D 15/00* | (2006.01) | |
| *F28F 7/02* | (2006.01) | |
| *H01L 23/36* | (2006.01) | |
| *H02K 9/22* | (2006.01) | |
| *F28D 21/00* | (2006.01) | |
| *F28F 21/00* | (2006.01) | |
| *F28F 13/00* | (2006.01) | |

(52) U.S. Cl.
CPC . *F28D 15/00* (2013.01); *F28F 7/02* (2013.01); *H01L 23/36* (2013.01); *H02K 9/22* (2013.01); *F28D 2021/0029* (2013.01); *F28F 21/00* (2013.01); *F28F 2013/006* (2013.01); *F28F 2210/02* (2013.01); *H01L 2924/0002* (2013.01)

(58) Field of Classification Search
CPC .. F28D 15/00; F28D 2021/0029; F28F 21/00; F28F 2210/02; F28F 2013/006; H01L 23/36; H01L 2924/0002; H01L 2924/00
USPC ............... 165/104.26, 104.17, 272, 273, 274, 165/275, 276, 277
See application file for complete search history.

(56) References Cited

U.S. PATENT DOCUMENTS

| | | | | |
|---|---|---|---|---|
| 2,624,556 A | * | 1/1953 | Kistler | .................... 165/104.15 |
| 3,576,210 A | * | 4/1971 | Trent | ....................... 165/104.26 |
| 4,190,855 A | * | 2/1980 | Inoue | .................... H01L 21/563 257/668 |
| 4,326,214 A | * | 4/1982 | Trueblood | ............. G11C 16/18 174/544 |

(Continued)

FOREIGN PATENT DOCUMENTS

GB        2388473 A  *  11/2003

OTHER PUBLICATIONS

Kobayashi, W., et al. "An Oxide Thermal Rectifier," Dept. of Applied Physics, Waseda University, Tokyo 169-8555, Japan, Dated: Oct. 7, 2009.

(Continued)

*Primary Examiner* — Ljiljana Ciric
(74) *Attorney, Agent, or Firm* — Dinsmore & Shohl LLP

(57) ABSTRACT

In one embodiment, a heat conducting composite material may include a bulk material, a conduit, and a conduit material. The bulk material forms a shaped body having a heat introduction portion and a heat dissipation portion. The conduit is disposed in the bulk material and connects the heat introduction portion to the heat dissipation portion. The conduit material is disposed within and fills the conduit. The bulk material thermal conductivity of the bulk material is about equal to a conduit material thermal conductivity of the conduit material at a first temperature. The bulk material thermal conductivity is less than or equal to the conduit material thermal conductivity throughout a first temperature range. The bulk material thermal conductivity is greater than or equal to the conduit material thermal conductivity throughout a second temperature range.

6 Claims, 5 Drawing Sheets

(56) References Cited

U.S. PATENT DOCUMENTS

| | | | |
|---|---|---|---|
| 4,657,067 A * | 4/1987 | Rapp et al. ................. | 165/10 |
| 5,259,436 A * | 11/1993 | Yun ................ | B22D 17/14 164/113 |
| 5,287,248 A | 2/1994 | Montesano | |
| 5,296,310 A * | 3/1994 | Kibler ................ | B32B 5/16 257/720 |
| 5,421,087 A * | 6/1995 | Newkirk .............. | C22C 29/00 29/897.2 |
| 5,526,867 A * | 6/1996 | Keck .................. | C04B 35/652 164/97 |
| 5,545,473 A * | 8/1996 | Ameen .............. | H01L 23/3737 257/E23.107 |
| 5,549,151 A * | 8/1996 | Yang ................... | B22D 19/14 164/97 |
| 5,618,635 A * | 4/1997 | Newkirk .............. | C22C 1/1015 428/545 |
| 5,657,811 A * | 8/1997 | Cook ................... | B22D 19/14 164/97 |
| 5,664,616 A * | 9/1997 | Gegel .................. | B22D 19/14 164/105 |
| 5,746,387 A * | 5/1998 | Pretto ................ | B65H 75/243 242/571.2 |
| 5,819,858 A * | 10/1998 | Nechansky ......... | H01L 21/4857 174/250 |
| 5,820,654 A * | 10/1998 | Gottzman ............ | B01D 53/229 95/39 |
| 5,838,063 A * | 11/1998 | Sylvester ............. | H01L 23/10 257/678 |
| 5,868,887 A * | 2/1999 | Sylvester ............. | H01L 23/145 156/150 |
| 5,944,097 A * | 8/1999 | Gungor ............... | H01L 23/3732 164/6 |
| 5,958,572 A * | 9/1999 | Schmidt ............. | H01L 23/3733 174/258 |
| 5,972,108 A * | 10/1999 | Beratan .............. | H01L 37/02 117/101 |
| 6,003,221 A * | 12/1999 | Sawtell ............... | C04B 41/88 174/16.3 |
| 6,016,007 A * | 1/2000 | Sanger ................ | H01L 23/473 257/706 |
| 6,037,066 A * | 3/2000 | Kuwabara ........... | B22F 7/008 257/675 |
| 6,183,855 B1 * | 2/2001 | Buckley ............... | 165/104.17 |
| 6,263,958 B1 * | 7/2001 | Fleishman ............ | 165/104.16 |
| 6,457,515 B1 | 10/2002 | Vafai et al. | |
| 6,460,598 B1 * | 10/2002 | Adams ................ | B22D 19/0072 164/30 |
| 6,595,264 B2 * | 7/2003 | Lutz-Nivet ............ | B22D 19/14 164/108 |
| 6,698,501 B2 * | 3/2004 | Fleischman ............ | 165/104.15 |
| 6,811,720 B2 * | 11/2004 | Qu ........................ | 165/104.15 |
| 6,871,700 B2 * | 3/2005 | Gorokhovsky ........ | 165/104.15 |
| 7,105,104 B2 * | 9/2006 | Chomard et al. ........ | 165/104.15 |
| 7,118,941 B2 | 10/2006 | Zhang et al. | |
| 7,157,019 B2 | 1/2007 | Klett et al. | |
| 7,220,365 B2 * | 5/2007 | Qu et al. ................ | 165/104.15 |
| 7,291,271 B2 * | 11/2007 | Galbraith ............... | 165/104.15 |
| 7,334,630 B2 | 2/2008 | Goodson et al. | |
| 7,360,309 B2 | 4/2008 | Vaidyanathan et al. | |
| 7,722,833 B2 | 5/2010 | Wang et al. | |
| 7,760,504 B2 * | 7/2010 | Farrow et al. ........... | 165/104.15 |
| 7,878,232 B2 * | 2/2011 | Arik et al. .............. | 165/80.2 |
| 8,075,799 B2 * | 12/2011 | Hong et al. ............. | 252/70 |
| 8,430,154 B2 * | 4/2013 | Yang et al. ............. | 165/104.15 |
| 8,859,882 B2 * | 10/2014 | Lu et al. ................. | 165/104.17 |
| 8,967,236 B2 * | 3/2015 | Catton et al. ........... | 165/104.26 |
| 8,973,650 B2 * | 3/2015 | Dhingra et al. ............ | 165/277 |
| 9,080,820 B2 * | 7/2015 | Bolton ................ | F28F 13/00 |
| 2005/0107870 A1 * | 5/2005 | Wang ................. | A61L 31/10 623/1.44 |
| 2005/0189093 A1 | 9/2005 | Im | |
| 2009/0255660 A1 | 10/2009 | Cornie et al. | |
| 2009/0308571 A1 | 12/2009 | Thompson et al. | |
| 2011/0095390 A1 * | 4/2011 | Sakai ................... | C04B 35/495 257/467 |
| 2013/0224632 A1 * | 8/2013 | Roumi ................. | H01M 2/166 429/516 |
| 2015/0171398 A1 * | 6/2015 | Roumi ................. | H01M 2/1673 429/7 |

OTHER PUBLICATIONS

Yoichi Takahashi & Masayuki Murabayashi (1975) Measurement of Thermal Properties of Nuclear Materials by Laser Flash Method, Journal of Nuclear Science and Technology, 12:3; 133-144.

T. Tomaru, et al. "Maximum heat transfer along a sapphire suspension fiber for a cryogenic interferometric gravitational wave detector" High Energy Accelerator Research Organization (KEK), 1-1 Oho, Tsukuba, Ibaraki, 305-0801, Japan.

David G. Cahill, et al. "Thermal conductivity of -A1203 and -A1203 wear-resistant coatings", Journal of Applied Physics, 83, 5738 (1998); doi: 10.1063/1/367500.

http://www.physics.udel.edu/~jqx/Phys646/Lab/serial_files/thermal_conductivity.jpg.

* cited by examiner

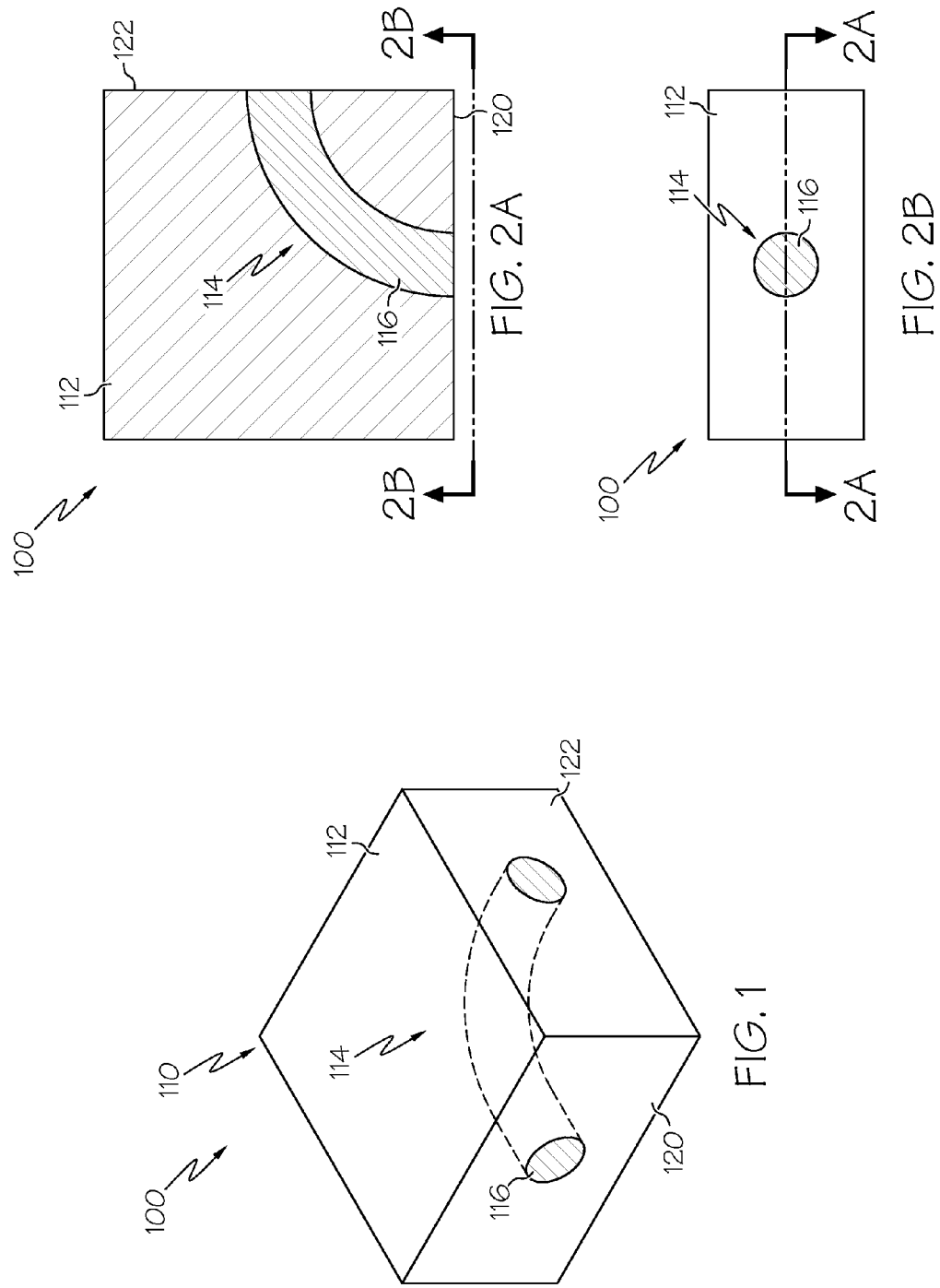

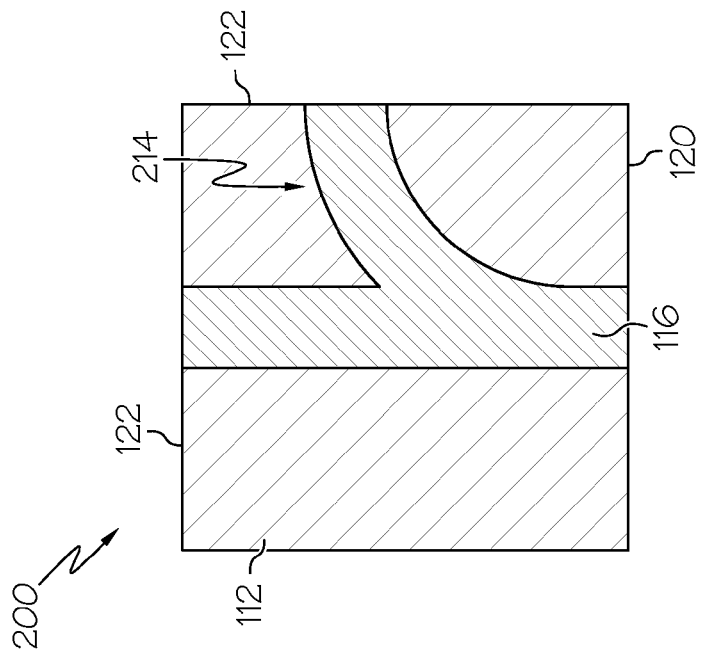
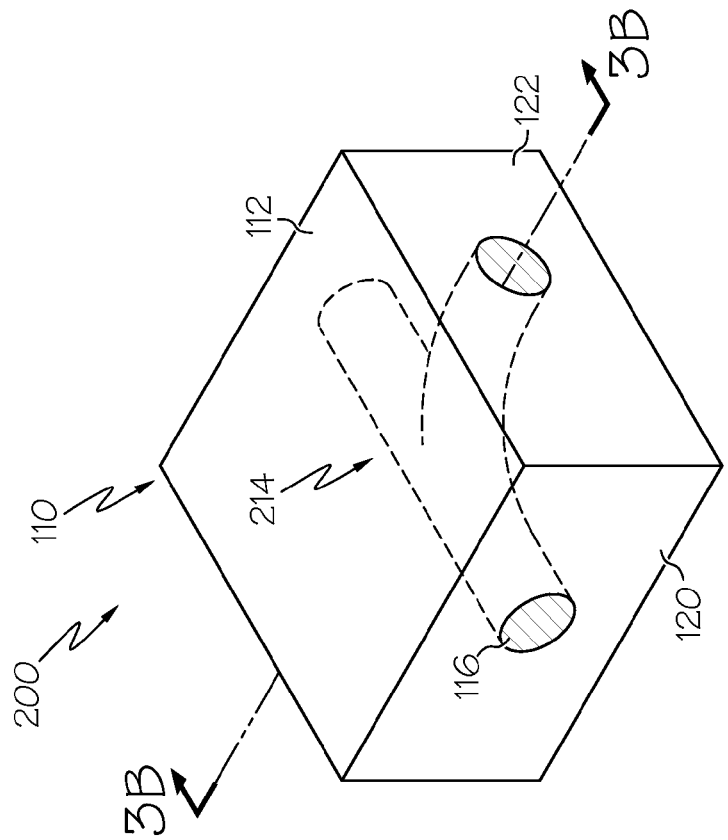
FIG. 3B
FIG. 3A

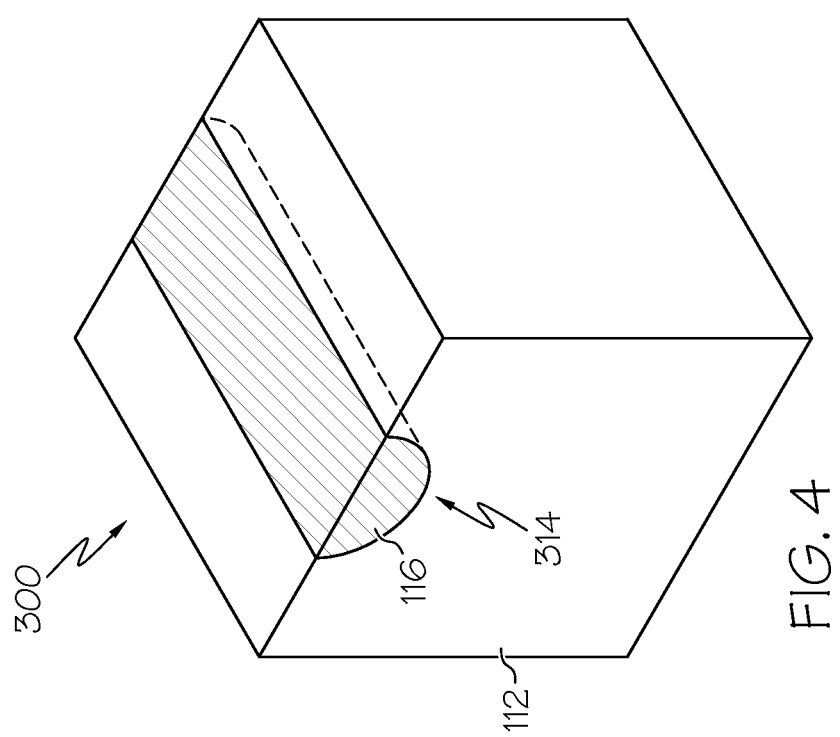

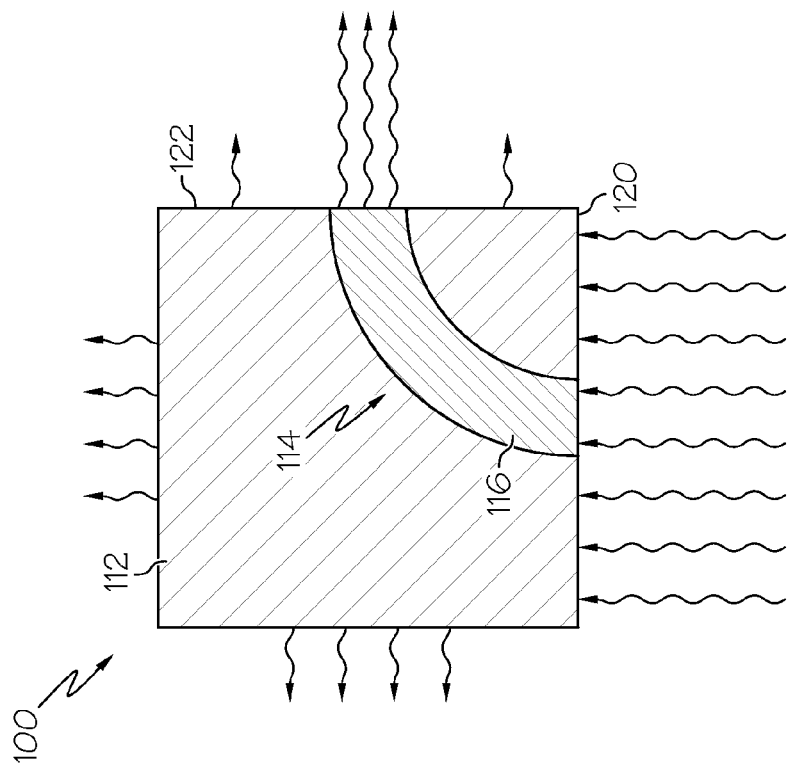
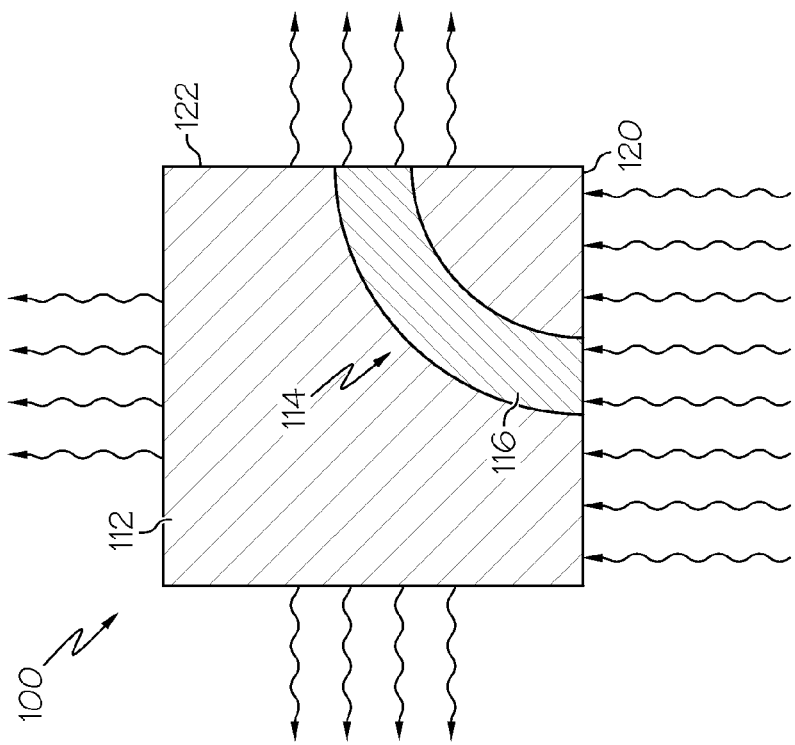

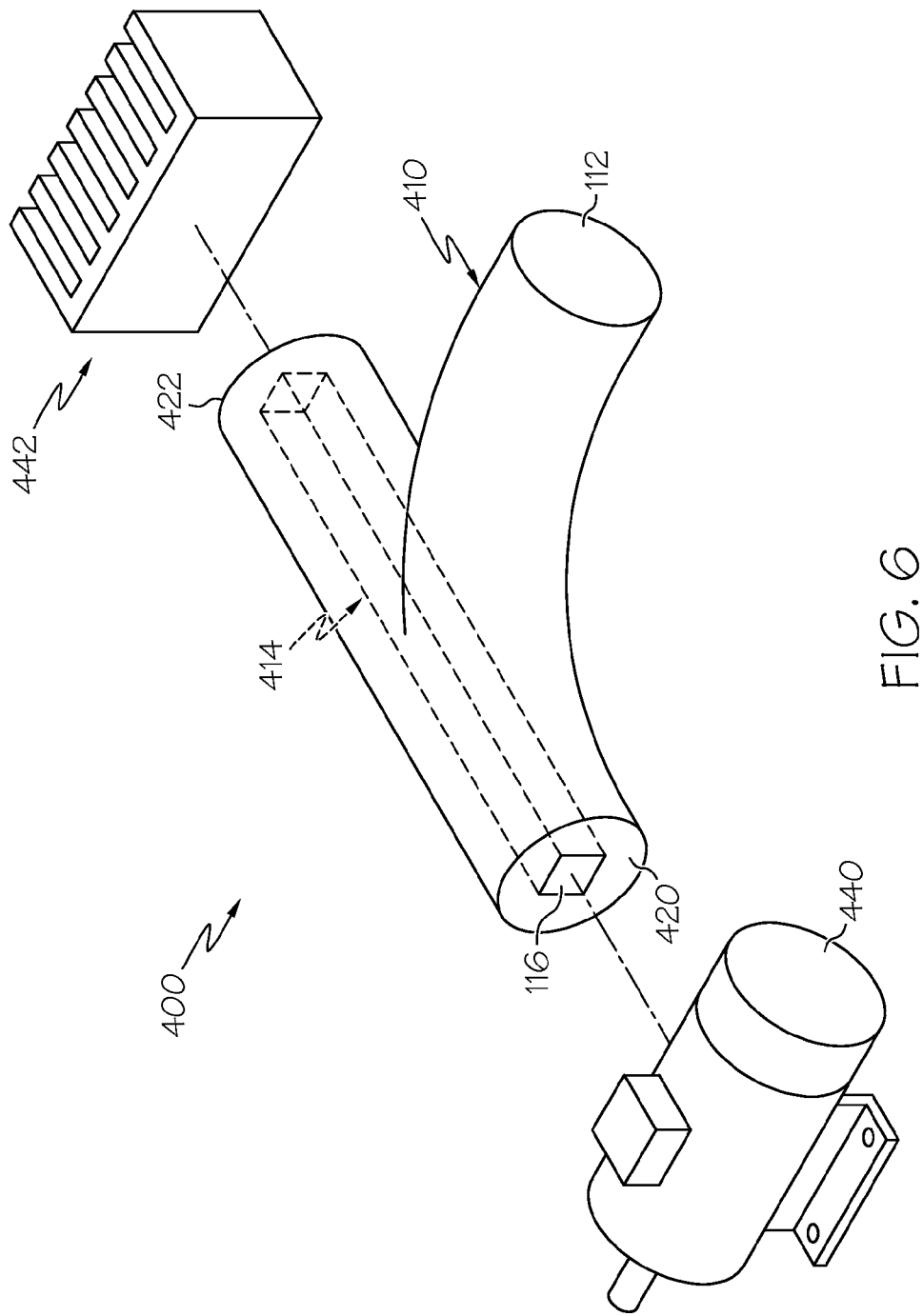

US 9,417,013 B2

HEAT TRANSFER SYSTEMS INCLUDING HEAT CONDUCTING COMPOSITE MATERIALS

TECHNICAL FIELD

The present specification generally relates to devices, systems and methods for conducting heat and, more specifically, to devices and systems for preferentially conducting heat and methods for manufacturing the same.

BACKGROUND

Machines such as mechanical or electrical machines and electrical components such as integrated circuits often operate within a desired temperature range. The desired temperature range is commonly selected in order to promote efficient operation. For example, an electric machine may require less electrical energy to generate a fixed amount of mechanical energy when held within a temperature range than would be required if the electric motor operated outside of the temperature range. Heat sinks are often employed to maintain an operating temperature within the desired temperature range by cooling the machine or electrical component when the operating temperature approaches the highest temperature of the desired temperature range.

The cooling effect is commonly caused by transferring heat generated by the machine or electrical component to a fluid medium, such as air or a liquid, with extended surfaces having a relatively large surface area in contact with the fluid medium. However, the transfer of heat is typically unidirectional or omni-directional.

Accordingly, a need exists for alternative devices and systems for preferentially conducting heat and methods for manufacturing the same.

SUMMARY

In one embodiment, a heat conducting composite material may include a bulk material, a conduit, and a conduit material. The bulk material forms a shaped body having a heat introduction portion and a heat dissipation portion. The conduit is disposed in the bulk material and connects the heat introduction portion to the heat dissipation portion. The conduit material is disposed within and fills the conduit. The bulk material thermal conductivity of the bulk material is about equal to a conduit material thermal conductivity of the conduit material at an activation temperature (a first temperature). The bulk material thermal conductivity is less than or equal to the conduit material thermal conductivity throughout an activation temperature range (a first temperature range). The bulk material thermal conductivity is greater than or equal to the conduit material thermal conductivity throughout a deactivation temperature range (a second temperature range).

In another embodiment, a system for transferring heat may include a heat conducting composite material and a heat generating device. The heat conducting composite material includes a bulk material forming a shaped body having a heat introduction portion and a heat dissipation portion, a conduit disposed in the bulk material, and connecting the heat introduction portion to the heat dissipation portion and a conduit material disposed within the conduit. A bulk material thermal conductivity of the bulk material is about equal to a conduit material thermal conductivity of the conduit material at an activation temperature. The bulk material thermal conductivity is not greater than the conduit material thermal conductivity throughout an activation temperature range. A heat generating device is in thermal communication with the heat introduction portion of the heat conducting composite material. The heat generating device operates at an operating temperature that is within the activation temperature range.

In yet another embodiment, a method for manufacturing a heat conducting composite material may include: providing a bulk material having a bulk material thermal conductivity; providing a conduit material having a conduit material thermal conductivity; and forming a shaped body having a heat introduction portion, a heat dissipation portion, and a conduit connecting the heat introduction portion to the heat dissipation portion. The bulk material thermal conductivity is about equal to the conduit material thermal conductivity at an activation temperature. The bulk material thermal conductivity is not greater than the conduit material thermal conductivity throughout an activation temperature range. The bulk material thermal conductivity is greater than the conduit material thermal conductivity throughout a deactivation temperature range. The shaped body includes the bulk material and the conduit is filled with the conduit material.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

FIG. 1 schematically depicts a heat conducting composite material according to one or more embodiments shown and described herein;

FIG. 2A schematically depicts a cross sectional view of the heat conducting composite material of FIG. 1 according to one or more embodiments shown and described herein;

FIG. 2B schematically depicts a cross sectional view of the heat conducting composite material of FIG. 1 according to one or more embodiments shown and described herein;

FIG. 3A schematically depicts a heat conducting composite material according to one or more embodiments shown and described herein;

FIG. 3B schematically depicts a cross sectional view of the heat conducting composite material of FIG. 3A according to one or more embodiments shown and described herein;

FIG. 4 schematically depicts a heat conducting composite material according to one or more embodiments shown and described herein;

FIG. 5A schematically depicts a cross sectional view of the heat conducting composite material of FIG. 1 according to one or more embodiments shown and described herein;

FIG. 5B schematically depicts a cross sectional view of the heat conducting composite material of FIG. 1 according to one or more embodiments shown and described herein; and FIG. 6 schematically depicts a system for transferring heat according to one or more embodiments shown and described herein.

DETAILED DESCRIPTION

FIG. 1 generally depicts one embodiment of a heat conducting composite material for dissipating heat in an omni-directional mode and a preferential conducting mode. The heat conducting composite material generally comprises a bulk material forming a shaped body, a conduit disposed in the bulk material, and a conduit material disposed within the conduit. Various embodiments of the heat conducting composite material, systems incorporating the heat conducting composite material and methods for forming heat conducting composite material are described in more detail herein.

Referring now to FIG. 1, the heat conducting composite material 100 transfers heat from a high temperature region of the heat conducting composite material 100 to a low temperature region of the heat conducting composite material 100. In one embodiment, the heat conducting composite material 100 comprises a shaped body 110 having a heat introduction portion 120 and a heat dissipation portion 122. The shaped body 110 is depicted in FIG. 1 as being substantially rectangular. It is noted that the shaped body 110 may be any shape such as, for example, cubic (FIG. 1) or substantially cylindrical (FIG. 6). In some embodiments (not shown), the shaped body 110 is irregularly shaped. For example, the shaped body 110 may be contoured to conform around a heat generating device with a complex geometry disposed within a fixed volume on one end and traverse though limited space to a source of ambient fluid, such as when the heat conducting composite material 100 is used to connect an engine within an engine compartment to ambient air.

While the heat introduction portion 120 and the heat dissipation portion 122 are depicted in FIG. 1 as surfaces, it is noted that the heat introduction portion 120 and the heat dissipation portion 122 may be any constituent of the shaped body 110 such as, for example, a surface, an edge or a volume. Generally, the heat introduction portion 120 is the portion of the shaped body 110 that receives thermal energy from an external heat source, and the heat dissipation portion 122 is the portion of the shaped body 110 that is cooled by an external cooling source. Thus, the heat introduction portion 120 is generally at a higher temperature than the heat dissipation portion 122. However, it is noted that the terms "heat introduction" and "heat dissipation" are used herein primarily for clarity. Embodiments of the present disclosure are reversible such that when the heat dissipation portion 122 is heated to a higher temperature than the heat introduction portion 120, heat may be transferred from the heat dissipation portion 122 to the heat introduction portion 120.

The heat introduction portion 120 is connected to the heat dissipation portion 122 via a conduit 114 positioned in the bulk material 112. The conduit 114 is a cavity or passage traversing through the shaped body 110. Referring now to FIG. 2A, which is a cross sectional view of the heat conducting composite material 100 of FIG. 1, the conduit 114 follows a single arc-shaped path. In another embodiment, depicted in FIGS. 3A and 3B, the heat conducting composite material 200 comprises a conduit 214 that follows a multi-pronged path. In this embodiment, the conduit 214 connects a heat introduction portion 120 to two heat dissipation portions 122. While the heat conducting composite material 200 is depicted in FIGS. 3A and 3B as having two heat dissipation portions 122, the embodiments described herein may have any number of heat dissipation portions 122. It is noted that the heat dissipation portion 122 and heat introduction portion 120 may be interchangeable, as is described above. Therefore, the embodiments described herein may have any number of the heat introduction portions 120.

Referring now to FIG. 2B, which is a cross sectional view of the heat conducting composite material 100 of FIG. 1, the conduit 114 is disposed within the bulk material 112. In one embodiment, the conduit 114 is completely surrounded by the conduit material 116. In another embodiment, depicted in FIG. 4, the conduit 314 is partially surrounded by the conduit material 116. In further embodiments (not depicted), the conduit may be a combination of the conduit 114 that is completely surrounded by the conduit material 116 and the conduit 314 that is partially surrounded by the conduit material 116. Specifically, the combined conduit may comprise multiple sections such that some of the sections of the combined conduit are within the shaped body 110 and some of the sections are formed on an outer surface of the shaped body 110.

Referring collectively to FIGS. 1 and 2B, the conduit 114 may comprise a substantially uniform cross sectional shape (e.g., circular) along the length of the conduit 114. The substantially uniform cross sectional shape may be any two dimensional shape such as, for example, half-circle (FIG. 4), square (FIG. 6), or polygonal. Additionally, it is noted that, in some embodiments, the conduit 114 may be irregularly shaped, i.e., a cross sectional shape that varies over the length of the conduit 114.

Referring collectively to FIGS. 1-4 and 5A-6, the bulk material 112 and the conduit material 116 may be any material such as, for example, ceramic materials, metallic materials or organic materials. The bulk material 112 and the conduit material 116 are in thermal contact with one another when formed or machined together. Each of the bulk material 112 and the conduit material 116 may be any state of matter such as, for example, gas, liquid, solid, or plasma. In the embodiments described herein, the bulk material 112 and the conduit material 116 are solid materials. The materials may be selected such that the melting points of the solid materials are above the normal working temperature of the application in which they are employed.

The bulk material 112 and the conduit material 116 comprise materials having temperature dependent thermal conductivities. Specifically, the bulk material 112 has a bulk material thermal conductivity and the conduit material 116 has a conduit material thermal conductivity, both of which are temperature dependent. However, the bulk material thermal conductivity has a different temperature dependence than the conduit material thermal conductivity. In one embodiment, the bulk material thermal conductivity and conduit material thermal conductivity are about equal to one another at an activation temperature of the conduit material 116.

For example, the bulk material 112 and the conduit material 116 may be perovskite cobalt oxides such as, for example, $LaCoO_3$ and $La_{0.7}Sr_{0.3}CoO_3$. In one embodiment, the activation temperature range comprises temperatures greater than the activation temperature. The bulk material 112 is $LaCoO_3$ and the conduit material 116 is $La_{0.7}Sr_{0.3}CoO_3$ with an activation temperature of about 80° K. The activation temperature range comprises temperatures higher than the activation temperature (i.e., temperatures>about 80° K). In the activation temperature range, the bulk material thermal conductivity (i.e., the thermal conductivity of the $LaCoO_3$) is less than the conduit material thermal conductivity (i.e., the thermal conductivity of the $La_{0.7}Sr_{0.3}CoO_3$). A deactivation temperature range comprises temperatures lower than the activation temperature (i.e., temperatures<about 80° K). In the deactivation temperature range, the bulk material thermal conductivity is greater than the conduit material thermal conductivity. Thus, the activation temperature range and the deactivation temperature range are mutually exclusive (i.e., the activation temperature range consists of temperatures greater than the activation temperature, and the deactivation temperature range consists of temperatures lower than the activation temperature).

In another embodiment, the activation temperature range comprises temperatures less than the activation temperature. In this embodiment, the bulk material 112 is $La_{0.7}Sr_{0.3}CoO_3$ and the conduit material 116 is $LaCoO_3$ with an activation temperature of about 80° K. The activation temperature range is less than the activation temperature. The deactivation temperature range is greater than the activation temperature. Further embodiments may comprise a bulk material 112 and a conduit material 116 such that the activation temperature range is less than and/or greater than the activation temperature.

The embodiments described herein may utilize any material with a temperature dependent thermal conductivity such as, but not limited to, sapphire, copper, platinum, gold, aluminum, beryllia, alumina, phosphor bronze, brass, manganin, stainless steel, pyrex, IMI 7031 varnish, quartz glass, teflon PTFE, and nylon. Again referring to FIG. 1, in one embodiment the bulk material 112 comprises brass and the conduit material 116 comprises beryllia (BeO). The activation temperature is about 10° K and the activation temperature range is greater than about 10° K. The conduit material thermal conductivity is about ten times greater than the bulk material conductivity for at least one temperature (e.g., at about 150° K the thermal conductivity is about 800 W/mK for BeO and thermal conductivity is about 80 W/mK for brass). The materials may be switched (i.e., bulk material 112 comprising BeO and conduit material 116 comprising brass) to maintain an activation temperature of about 10° K and to yield an activation temperature range that is less than about 10° K. The conduit material thermal conductivity is about twelve times greater than the bulk material conductivity for at least one temperature (e.g., at about 3° K the thermal conductivity is about 6 W/mK for brass and thermal conductivity is about 0.5 W/mK for BeO).

In another example, the bulk material 112 comprises sapphire and the conduit material 116 comprises BeO. The activation temperature is about 85° K and the activation temperature range is greater than or equal to about 85° K. The conduit material thermal conductivity is about four times greater than the bulk material conductivity for at least one temperature (e.g., at about 150° K the thermal conductivity is about 800 W/mK for BeO and thermal conductivity is about 200 W/mK for sapphire). The materials may be switched (i.e., bulk material 112 comprising BeO and conduit material 116 comprising sapphire) to maintain an activation temperature of about 85° K and to yield an activation temperature range that is less than about 85° K. The conduit material thermal conductivity is about thirty-five times greater than the bulk material conductivity for at least one temperature (e.g., at about 40° K the thermal conductivity is about 7,000 W/mK for sapphire and thermal conductivity is about 200 W/mK for BeO). It is noted that while the examples described above relate to activation temperatures less than about 85° K, embodiments of the present disclosure are not limited to such temperature ranges (i.e., the activation temperature may be increased through the selection of suitable materials).

While specific examples utilizing specific combinations of materials have been described herein, it should be understood that other combinations may also be used, so long as the bulk material thermal conductivity to change with temperature at a different rate than the conduit material thermal conductivity (i.e., the slope of the bulk material thermal conductivity versus temperature differs from the slope of the conduit material thermal conductivity versus temperature).

Again referring to FIG. 1, the embodiments of the heat conducting composite material described herein may be formed by sintering a powder made up of the bulk material 112 and the conduit material 116. Sintering may reduce porosity and minimize grain boundaries of the sintered materials. For example, the bulk material 112 may be finely ground into a powder. The powder may be shaped into the desired shape using pressure (e.g., pressurized mold). The compacted powder may be sintered to form a shaped body 110 from the bulk material 112. The conduit material 116 may also be ground into a powder, and formed into a shape corresponding to the conduit 114 of the shaped body 110. The compacted powder of conduit material 116 may be sintered to bond the conduit material 116 into a shape corresponding to the conduit 114. The shaped body 110 may be filled with the conduit material 116. The conduit material 116 may be bonded to the bulk material 112 with silver paste having a high thermal conductivity to reduce contact thermal resistance. The combined materials may then be annealed to dry the paste and reduce the likelihood of changes in the combined materials over time. While sintering is described above, it is noted that the embodiments described herein may be created by machining processes such as, for example, turning, boring, drilling, milling, broaching, sawing, shaping, reaming, tapping, electrical discharge machining, electrochemical machining, electron beam machining, photochemical machining, ultrasonic machining, deposition, etching and the like.

Referring collectively to FIGS. 5A and 5B, the embodiments described herein operate in two regimes—a deactivation temperature range (FIG. 5A) and an activation temperature range (FIG. 5B). Heat may radiate into and out of the heat conducting composite material 100. Heat radiation is generally depicted in FIGS. 5A and 5B as wavy lines. The wavy lines have arrows indicative of the radiation direction (i.e., arrows pointing to the heat conducting composite material 100 indicate heat radiating into the heat conducting composite material 100, and arrows pointing away from the heat conducting composite material 100 indicate heat radiating from the heat conducting composite material 100). The relative size of the wavy lines are indicative of relative amounts of heat (i.e., longer lines are indicative of a relatively high amount of heat flux and shorter lines are indicative of a relatively low amount of heat flux). It is noted that the schematic depictions are provided to illustrate relative changes in heat radiation qualitatively, and are not drawn to scale.

Referring now to FIG. 5A, the heat conducting composite material 100 is depicted in the deactivation temperature range. When in the deactivation temperature range the heat conducting composite material 100 is at a temperature such that the conduit material thermal conductivity of the conduit material 116 is less than the bulk material thermal conductivity of the bulk material 112, as is described in greater detail above. Heat radiates into the heat conducting composite material via the heat introduction portion 120. The application of thermal energy to the heat introduction portion 120 causes a localized temperature increase in the heat conducting composite material 100 proximate to the heat introduction portion 120. Therefore, heat is transferred through the heat conducting composite material 100 and radiated outward. Since the bulk material thermal conductivity is higher than the conduit material thermal conductivity, heat is dissipated in an omni-directional mode. Specifically, the bulk material 112 is more efficient at conducting heat than the conduit material 116 below the activation temperature. Thus, in embodiments where the heat conducting composite material 100 comprises more bulk material 112 than conduit material 116, the heat conducting composite material will radiate heat in a substantially uniform manner. It is noted that the uniformity of heat radiation is dependent upon the shape of the shaped body 110, the difference in thermal conductivity, and the percentage of the heat conducting composite material 100 that is bulk material 112.

Referring now to FIG. 5B, the heat conducting composite material 100 is depicted in the activation temperature range. When in the activation temperature range the heat conducting composite material 100 is at a temperature such that the conduit material thermal conductivity of the conduit material 116 is greater than the bulk material thermal conductivity of the bulk material 112, as is described above. Heat radiates into the heat conducting composite material via the heat introduction portion 120. The application of thermal energy to the heat introduction portion 120 causes a localized temperature increase in the heat conducting composite material 100 proximate to the heat introduction portion 120. Heat is transferred through the heat conducting composite material 100 and is radiated outward. Since the conduit material thermal conductivity is higher than the bulk material thermal conductivity at temperatures greater than the activation temperature, heat is dissipated in a preferentially conducting mode. Specifically, the conduit material 116 is more efficient at conducting heat than the bulk material 112. Therefore, heat is transferred from the heat introduction portion 120 to the heat dissipation portion 122 preferentially though the conduit material. As a result of the preferential heat transfer, the amount of heat radiating from the bulk material 112 is decreased.

The relative amounts of heat transferred by the conduit material 116 and the bulk material 112 is dependent upon the difference in thermal conductivity, and the percentage of the heat conducting composite material 100 that is conduit material 116. Generally, a larger amount of heat will be transferred by the conduit material 116 with an increase in the percentage of conduit material 116 in the heat conducting composite material 100. Also, an increase in the difference between the conduit material thermal conductivity and the bulk material thermal conductivity above the activation temperature increases the amount of heat transferred by the conduit material 116. For example, if the conduit material thermal conductivity is increased from four times the bulk material thermal conductivity to thirty-five times the bulk material thermal conductivity, heat is conducted with greater preference to the conduit material 116 (i.e., heat radiation is more focused in the conduit material 116 at the heat dissipation portion 122).

Referring to FIG. 6, a system for transferring heat is schematically depicted. The system comprises a heat conducting composite material 400 having a heat introduction portion 420 and a heat generating device 440 in thermal communication with the heat introduction portion 420. The heat generating device 440 may be any type of machine or machine component that generates heat such as, for example, a motor, an exhaust system, an electrical component, an actuator and the like. The heat conducting composite material 400 comprises a bulk material 112 that forms a shaped body 410. The shaped body 410 comprises a conduit 414 disposed in the bulk material 112. The conduit 114 connects the heat introduction portion 420 to the heat dissipation portion 422. The conduit material 116 is disposed within the conduit 414 and in this embodiment has a square cross section. The shaped body 410 is depicted in FIG. 6 as comprising a secondary member forming a secondary thermal pathway.

The heat generating device 440 operates at various operating temperatures. The heat generating device 440 transfers thermal energy to the heat conducting composite material 400 such that, as the operating temperature fluctuates, the temperature of the heat conducting composite material 400 fluctuates. The heat conducting composite material 400 cooperates with the heat generating device 440 to regulate the operating temperature of the heat generating device 440.

In one embodiment, the operating temperature range of the heat generating device 440 overlaps with the activation temperature range of the heat conducting composite material 400. For example, the heat generating device 440 operates over a preferred range of operating temperatures (e.g., the heat generating device may be a motor rated for use within a provided temperature range). The heat generating device 440 is selectively cooled by providing a heat conducting composite material with an activation temperature that is within the operating temperature range (e.g., in the upper half of the operating range) and an activation temperature range that comprises temperatures greater than the activation temperature. An appropriate activation temperature and activation temperature range are provided by selecting an appropriate bulk material 112 and an appropriate conduit material 116, as is described hereinabove. Thus, when the heat generating device 440 is operated at a temperature that exceeds the activation temperature, the heat conducting composite material 400 is transitioned into the activation temperature range. Heat is then preferentially transferred from the heat generating device 440 via the conduit material 116.

Still referring to FIG. 6, the system also comprises a heat sink 442 in thermal communication with the heat dissipation portion 422 of the heat conducting composite material 400. The heat sink 442 provides enhanced preferential cooling by communicating thermal energy between the conduit material 116 and a cooling fluid (e.g., liquid, gas, plasma and the like). The heat sink 442 may be any device that communicates thermal energy with a fluid medium such as, for example, a cold plate, a heat exchanger, a radiator, and the like.

It should now be understood that the heat conducting composite materials described herein may be utilized to regulate the temperature of a device. For example, it may be necessary to selectively administer heat to a device to keep the device above a desired temperature. The bulk material and conduit material of the heat conducting composite material may be selected such that the activation temperature of the heat conducting composite material is near the desired temperature and the activation temperature range comprises temperatures lower than the activation temperature. One end of the conduit may be in thermal communication with the device and the other end of the conduit may be in thermal communication with a heat source kept at a temperature above the desired operating range. As the temperature falls below the activation range, the conduit material directs thermal energy to the device to increase the device temperature. Thus, the embodiments described herein may be utilized to provide a passive temperature control that selectively heats devices such as, for example, a cold engine in automobile.

It is noted that the terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A system for transferring heat, the system comprising:
a heat conducting composite material comprising a bulk material forming a shaped body having a heat introduction portion and a heat dissipation portion;
a conduit disposed in the bulk material and connecting the heat introduction portion to the heat dissipation portion; and
a conduit material disposed within and filling the conduit, wherein:
the conduit material has a different composition than the bulk material;
the thermal conductivity of the bulk material is temperature dependent and the thermal conductivity of the conduit material is temperature dependent;
the thermal conductivity of the bulk material is equal to the thermal conductivity of the conduit material at an activation temperature; and
the thermal conductivity of the bulk material is less than or equal to the thermal conductivity of the conduit material throughout an activation temperature range; and
a heat generating device in thermal communication with the heat introduction portion of the heat conducting composite material, wherein the heat generating device operates at an operating temperature that is within the activation temperature range, and wherein the melting point of the bulk material and the melting point of the conduit material are above the operating temperature of the heat generating device such that the bulk material is solid and the conduit material is solid.

2. The system for transferring heat of claim 1, further comprising a heat sink in thermal communication with the heat dissipation portion of the heat conducting composite material and a cooling fluid.

3. The system for transferring heat of claim 1, wherein the thermal conductivity of the bulk material is greater than the thermal conductivity of the conduit material throughout a deactivation temperature range.

4. The system for transferring heat of claim 3, wherein the deactivation temperature range comprises higher temperatures than the activation temperature.

5. The system for transferring heat of claim 3, wherein the deactivation temperature range comprises lower temperatures than the activation temperature.

6. The system for transferring heat of claim 1, wherein the thermal conductivity of the conduit material is equal to at least two times the thermal conductivity of the bulk material at one temperature in the activation temperature range.

* * * * *